(12) United States Patent
Chiang et al.

(10) Patent No.: US 8,125,795 B2
(45) Date of Patent: Feb. 28, 2012

(54) CIRCUIT MODULE AND CIRCUIT BOARD ASSEMBLY HAVING SURFACE-MOUNT CONNECTOR

(75) Inventors: Chih-Hung Chiang, Taoyuan Hsien (TW); Kai-Hung Huang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 335 days.

(21) Appl. No.: 12/037,289

(22) Filed: Feb. 26, 2008

(65) Prior Publication Data

US 2009/0135571 A1 May 28, 2009

(30) Foreign Application Priority Data

Nov. 28, 2007 (TW) ................ 96145238 A

(51) Int. Cl.
*H05K 1/11* (2006.01)
*H05K 1/14* (2006.01)

(52) U.S. Cl. ........................ 361/804; 174/250

(58) Field of Classification Search .......... 361/804, 361/784; 174/250, 261; 439/74, 83; 29/843; 257/738–741
See application file for complete search history.

(56) References Cited

U.S. PATENT DOCUMENTS

| 5,420,377 | A | * | 5/1995 | Bresin et al. | ............... 174/263 |
| 5,699,612 | A | * | 12/1997 | Inoue et al. | ............... 29/843 |
| 5,872,399 | A | * | 2/1999 | Lee | ............... 257/738 |
| 6,376,782 | B1 | * | 4/2002 | Kimura et al. | ............... 174/267 |
| 2007/0281515 | A1 | * | 12/2007 | Hsiao et al. | ............... 439/83 |

* cited by examiner

*Primary Examiner* — Yuriy Semenenko
(74) *Attorney, Agent, or Firm* — Kirton & McConkie; Evan R. Witt

(57) ABSTRACT

The present invention relates to a surface-mount connector for electrically interconnecting a first circuit board and a second circuit board. The surface-mount connector includes a first end part and a second end part. The first end part is bonded onto the first circuit board. The second end part has a sidewall and a receptacle defined within the sidewall for receiving a solder bump therein. The solder bump is partially protruded from the sidewall and bonded onto the second circuit board such that the first circuit board and the second circuit board are electrically connected to each other.

14 Claims, 12 Drawing Sheets

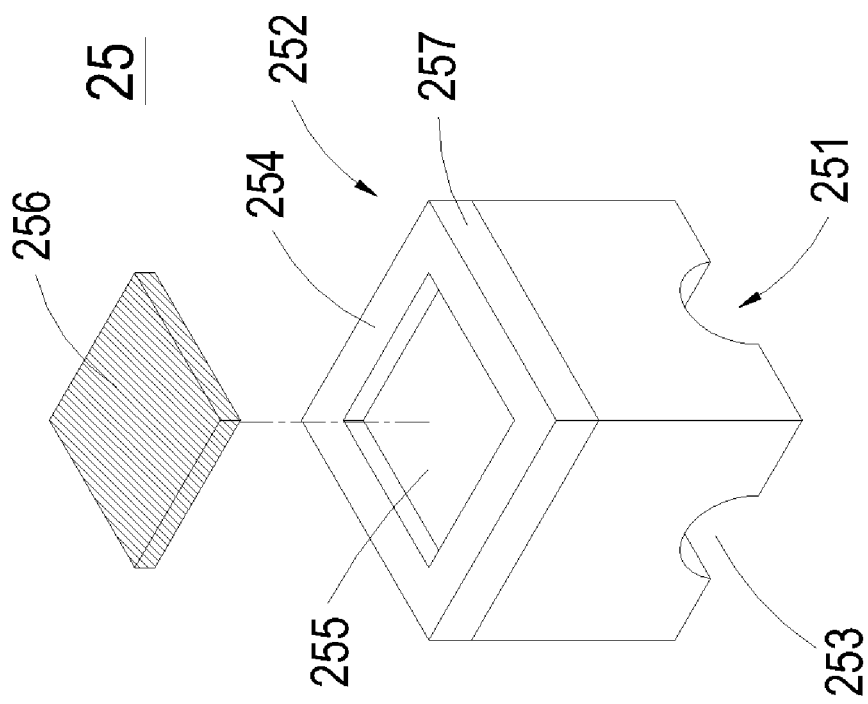
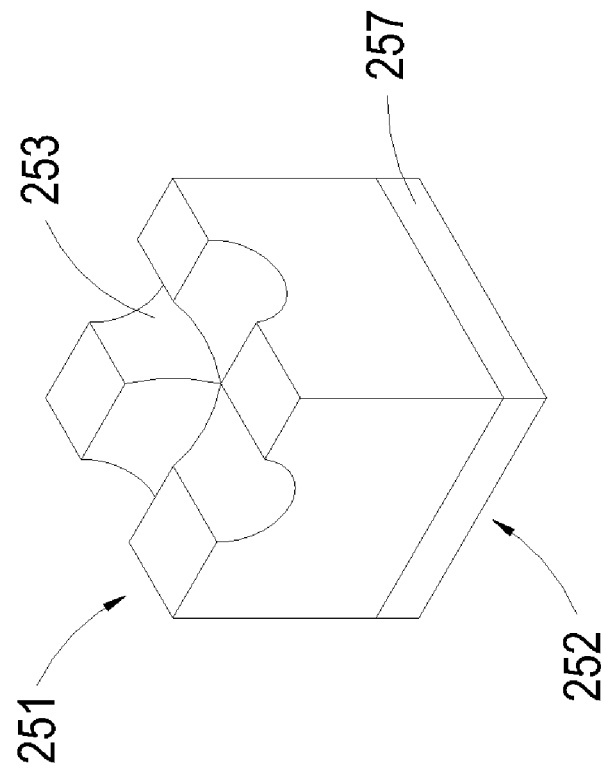
FIG. 5B
FIG. 5C

CIRCUIT MODULE AND CIRCUIT BOARD ASSEMBLY HAVING SURFACE-MOUNT CONNECTOR

FIELD OF THE INVENTION

The present invention relates to a connector, and more particularly to a surface-mount connector. The present invention also relates to a circuit module having a surface-mount connector and a circuit board assembly having two circuit boards interconnected by such a surface-mount connector.

BACKGROUND OF THE INVENTION

With increasing of electronic industries, electronic devices are developed toward minimization, high operating speed and increasing integration level. As a consequence, the requirement of increasing the pin density of the semiconductor packages becomes more important. A connector, for example, a conductive pin is widely used to electrically and/or structurally interconnect two circuit boards.

Currently, by using a surface mount technology (SMT), circuits or electronic components on two circuit boards are electrically connected with each other via this type of surface-mount connector. Referring to FIG. 1, a schematic exploded view of a circuit board assembly having two circuit boards interconnected by a surface-mount connector according to the prior art is illustrated. As shown in FIG. 1, the circuit board assembly 1 comprises a circuit module 10 and a second circuit board 13. The circuit module 10 includes a first circuit board 11 and multiple connectors 12 (i.e. conductive pins). Several electronic components 111 and 131 are disposed on the first circuit board 11 and the second circuit board 13 respectively. For a purpose of electrically and/or structurally connecting the first circuit board 11 with the second circuit board 13, solder paste 14 is firstly applied to predetermined solder pads on the lower side of the first circuit board 11. Then, the conductive pins 12 are placed on the solder pads of the first circuit board 11. After the first circuit board 11 passes through a reflow furnace (not shown), the conductive pins 12 are securely bonded to the solder pads on the first circuit board 11. Then, solder paste 14 is applied to predetermined solder pads on the upper side of the second circuit board 13 and the conductive pins 12 are placed on the solder pads of the second circuit board 13. After the first circuit board 11 and the second circuit board 13 pass through the reflow furnace (not shown), the conductive pins 12 are securely bonded onto the first circuit board 11 and the second circuit board 13. Meanwhile, the electronic components 111 on the first circuit board 11 and the electronic components 131 on the second circuit board 13 are electrically connected to each other through the conductive pins 12 (i.e. the surface-mount connectors).

The structure of FIG. 1, however, still has some drawbacks. For example, since it is difficult to control the thickness of the solder paste 14, the lower surfaces of the surface-mount connectors 12 are usually not coplanar after the upper surfaces of these surface-mount connectors 12 are bonded on the first circuit 11. The first circuit board 11 of the circuit module 10 is often subject to deformation during the process of passing through the reflow furnace. That is, there is often a height difference h between any two adjacent surface-mount connectors 12. As known, the relatively longer surface-mount connectors 12 and the relatively shorter surface-mount connectors 12 fail to be adjusted to be at the same levels. In a case that the height difference h is greater than the thickness of the solder paste 14 on the second circuit board 13, some surface-mount connectors 12 fail to be in close contact with the solder paste 14 coated on the second circuit board 13 and thus are often suffered from poor solderability. Therefore, the electrical connection and the structural stability between the first circuit 11 and the second circuit board 13 are impaired, and the product yield is reduced.

For avoiding the problem of causing poor solderability between the surface-mount connectors 12 and the second circuit board 13, the height difference h between any two adjacent surface-mount connectors 12 should be adjusted to be as small as possible. Since the thickness of the solder paste 14 on the second circuit board 13 is very small (e.g. about 0.12~0.15 mm), it is difficult to control the process of fabricating the circuit board assembly.

Therefore, there is a need of providing a circuit module and a circuit board assembly having surface-mount connectors in order to simplify the fabricating process, save cost and avoid poor solderability.

SUMMARY OF THE INVENTION

It is an object of the present invention to provide a surface-mount connector for use with a circuit board assembly in order to avoid the problem of causing poor solderability.

Another object of the present invention provides a circuit board assembly having two circuit boards interconnected by such a surface-mount connector, thereby increasing the product yield.

In accordance with an aspect of the present invention, there is provided a surface-mount connector for electrically interconnecting a first circuit board and a second circuit board. The surface-mount connector includes a first end part and a second end part. The first end part is bonded onto the first circuit board. The second end part has a sidewall and a receptacle defined within the sidewall for receiving a solder bump therein. The solder bump is partially protruded from the sidewall and bonded onto the second circuit board such that the first circuit board and the second circuit board are electrically connected to each other.

In an embodiment, the sidewall is extended from the periphery of the second end part.

In an embodiment, the outer periphery of the sidewall is coated with non-solderable primer.

In an embodiment, an indentation is formed in a surface of the first end part to function as a venting channel for venting gas during the first end part is bonded onto the first circuit board according to a surface mount technology.

In an embodiment, the first circuit board has a through hole corresponding to the first end part, and the first end part is inserted into the through hole of the first circuit board.

In an embodiment, the second circuit board has a conductive pad corresponding to the second end part, and the second end part is bonded onto the conductive pad of the second circuit board such that the first circuit board and the second circuit board are electrically connected to each other.

In an embodiment, the solder bump is partially protruded from the sidewall to form a curved convex surface.

In accordance with another aspect of the present invention, there is provided a circuit board assembly. The circuit board assembly includes a first circuit board, a second circuit board and multiple surface-mount connectors arranged between the first circuit board and the second circuit board. Each surface-mount connector includes a first end part and a second end part. The first end part is bonded onto the first circuit board, the second end part has a sidewall and a receptacle defined within the sidewall for receiving a solder bump therein, and the solder bump is partially protruded from the sidewall and bonded onto the second circuit board such that the first circuit board and the second circuit board are electrically connected to each other.

In accordance with another aspect of the present invention, there is provided a circuit module to be mounted on a system board. The circuit module includes a circuit board and multiple surface-mount connectors. Each surface-mount connector includes a first end part and a second end part. The first end part is bonded onto the first circuit board. The second end part has a sidewall and a receptacle defined within the sidewall for receiving a solder bump therein. The solder bump is partially protruded from the sidewall and bonded onto the system board such that the circuit board is electrically connected to the system board.

The above contents of the present invention will become more readily apparent to those ordinarily skilled in the art after reviewing the following detailed description and accompanying drawings, in which:

BRIEF DESCRIPTION OF THE DRAWINGS

FIG. 5B is a schematic exploded view of one surface-mount connector shown in FIG. 5A;

FIG. 5C is a schematic backside view of the surface-mount connector shown in FIG. 5B.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
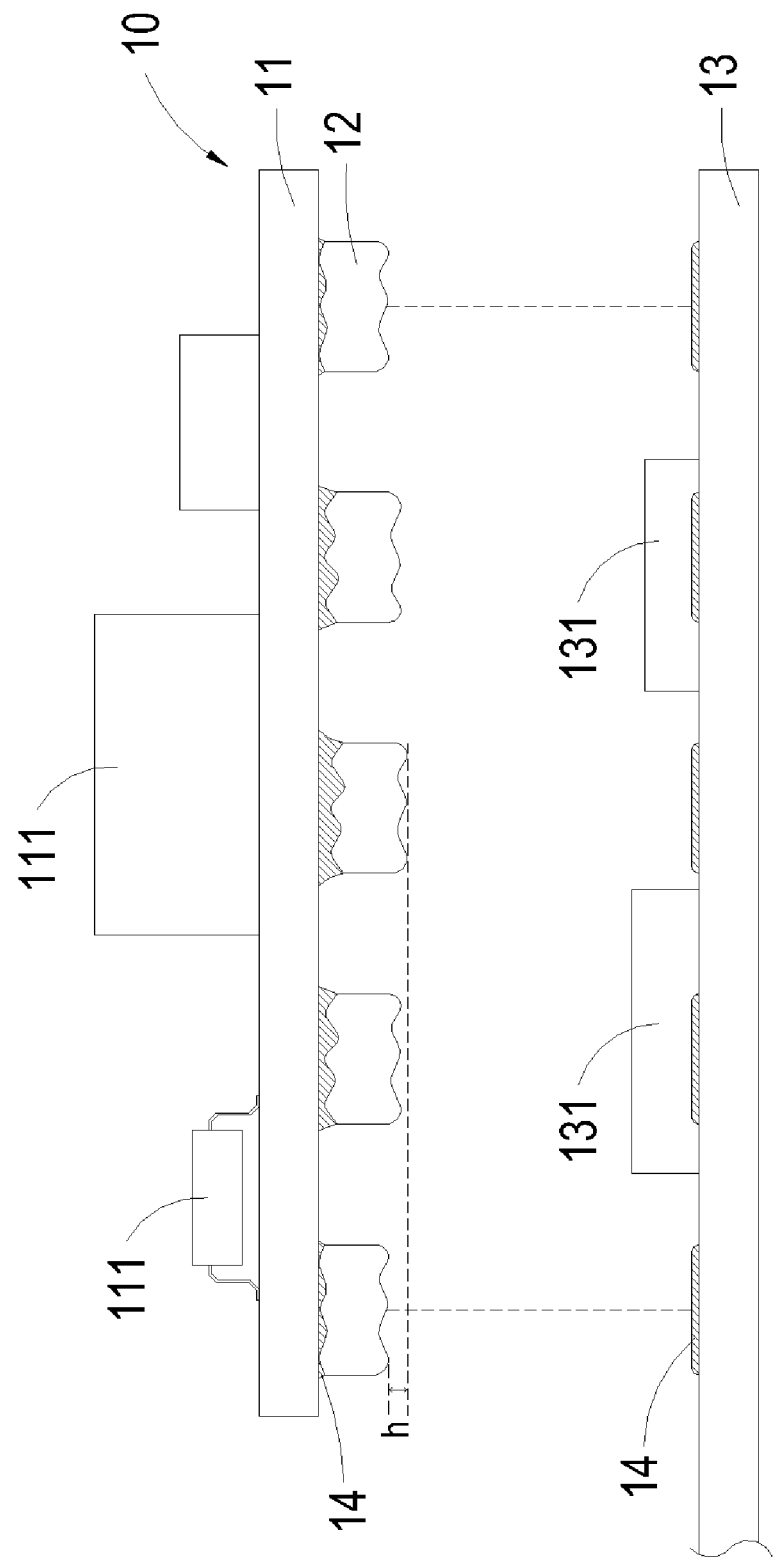
FIG. 1 is a schematic exploded view illustrating a circuit board assembly having two circuit boards interconnected by a surface-mount connector according to the prior art.
Figure 2A:
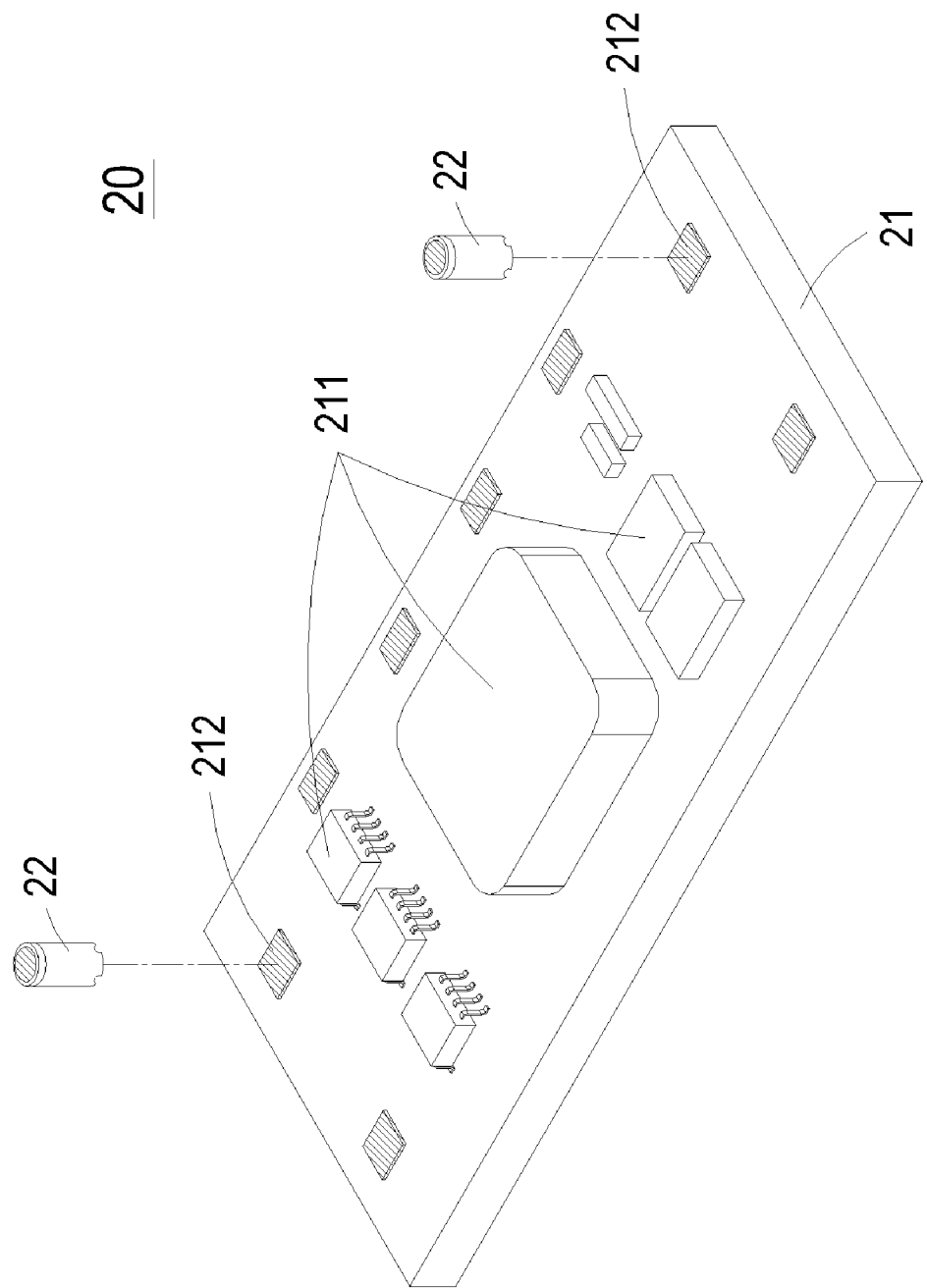
FIG. 2A is a schematic exploded view illustrating a circuit module according to a first preferred embodiment of the present invention.

FIG. 2A is a schematic exploded view illustrating a circuit module according to a first preferred embodiment of the present invention. The circuit module 20 of FIG. 2A is for example a DC-to-DC rectifier module. The circuit module 20 principally includes a first circuit board 21 and multiple surface-mount connectors 22. The surface-mount connectors 22 are mounted on the first circuit board 21. In addition, several electronic components 211 including resistors, capacitors, chips and the like are mounted on the first circuit board 21. Moreover, the first circuit board 21 has conductive pads 212 (e.g. solder paste, solder pad and the like) on predetermined locations of the surface of first circuit board 21. The conductive pad 212 has been coated with conductive and solderable material, e.g. soldering paste. Via the conductive pad 212, the surface-mount connectors 22 are firmly bonded onto the first circuit board 21 after the first circuit board 21 and the surface-mount connectors 22 pass through a reflow furnace (not shown).

Figure 2C:
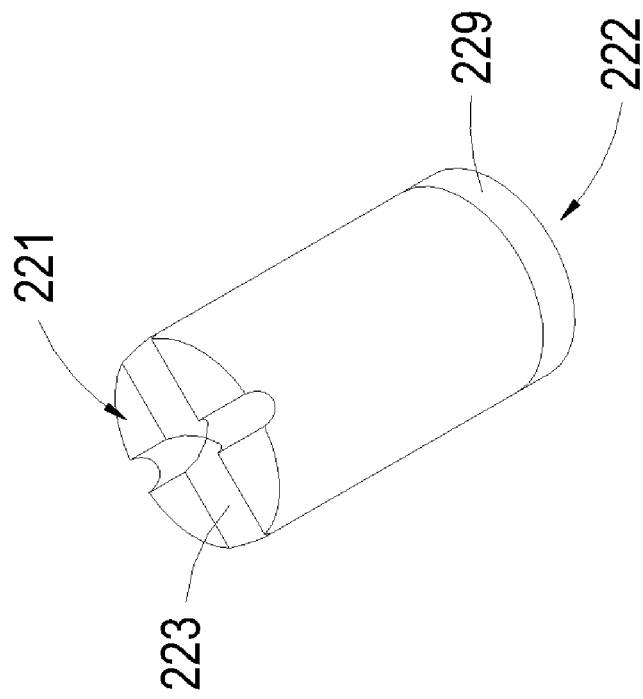
FIG. 2C is a schematic backside view of the surface-mount connector shown in FIG. 2B.
Figure 2B:
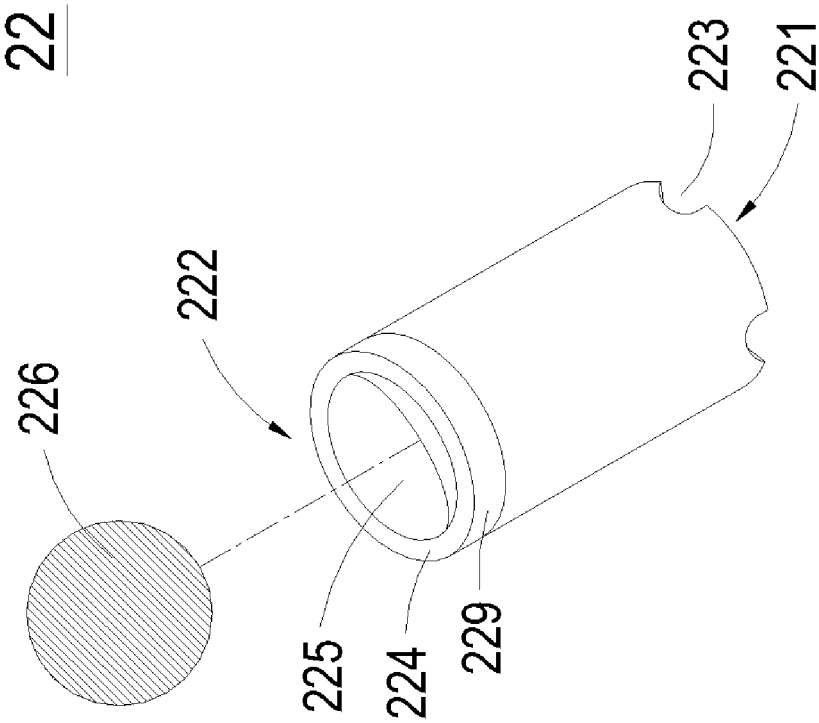
FIG. 2B is a schematic exploded view of one surface-mount connector shown in FIG. 2A.
Figure 3A:
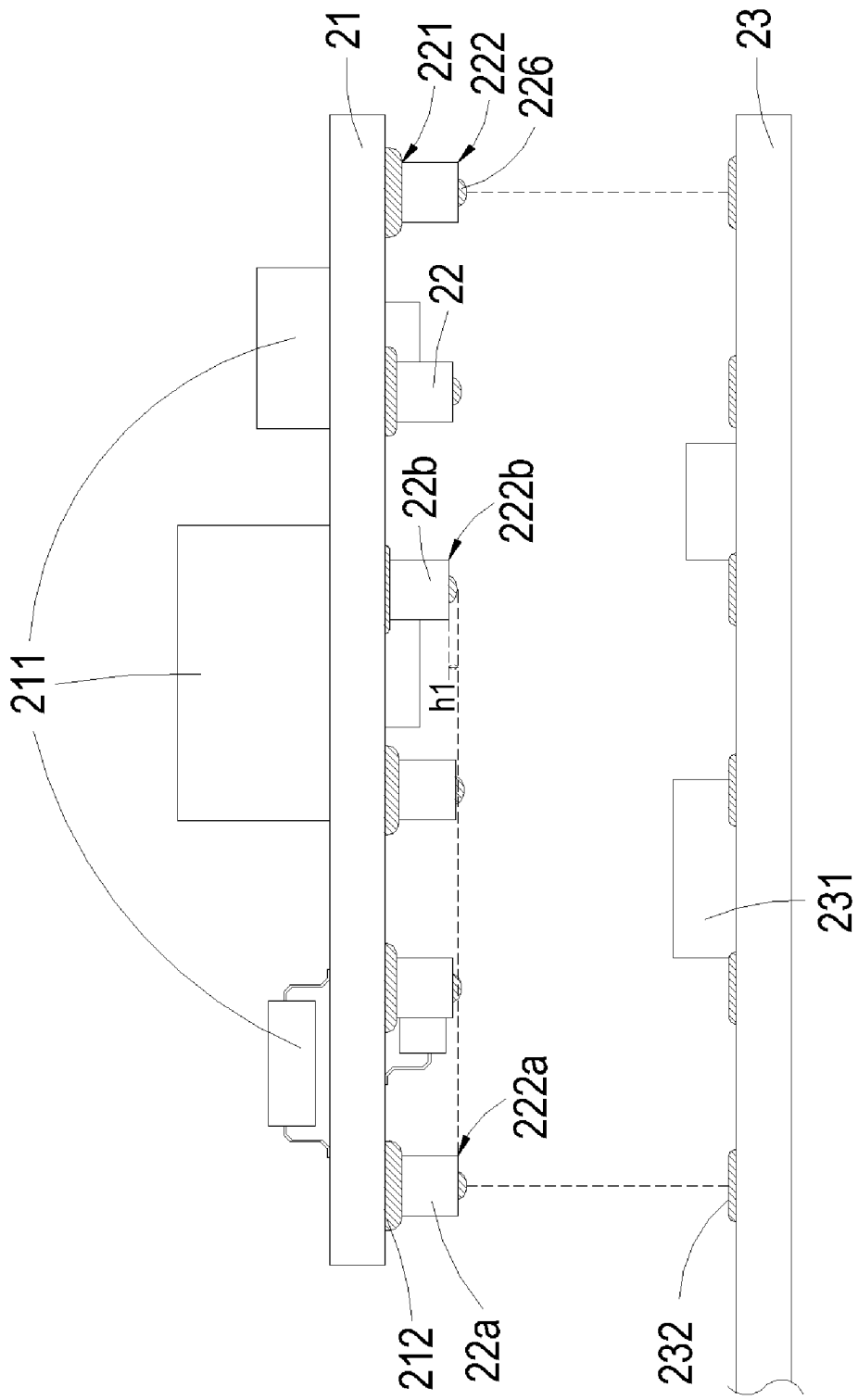
FIG. 3A is a schematic exploded view illustrating a circuit board assembly by mounting the circuit module of FIG. 2A on a second circuit board.
Figure 3B:
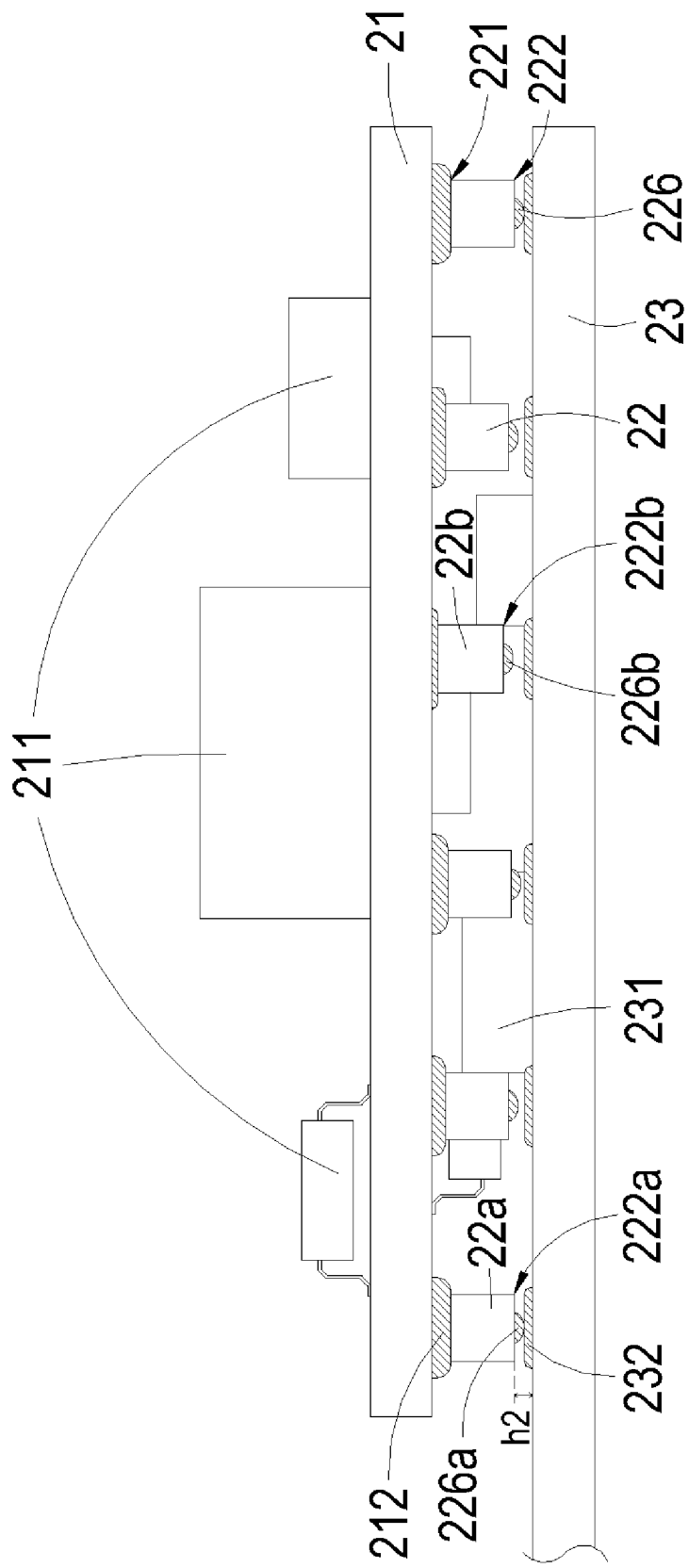
FIG. 3B is a schematic view illustrating that the circuit module of FIG. 3A is placed on the second circuit board.

FIG. 2B is a schematic exploded view of one surface-mount connector shown in FIG. 2A. FIG. 2C is a schematic backside view of the surface-mount connector shown in FIG. 2B. The surface-mount connector 22 is substantially a cylindrical rod with a diameter of for example 2 mm and a length of for example 3 mm. The surface-mount connector 22 is made of conductive material (e.g. metallic material). The surface-mount connector 22 includes a first end part 221 and a second end part 222, which are disposed on opposite sides of the surface-mount connector 22. The first end part 221 and the second end part 222 are respectively connected to the first circuit board 21 and the second circuit board 23 (i.e. system board) (as shown in FIG. 3B). An indentation 223 is formed in the surface of the first end part 221. The indentation 223 may have an arbitrary shape such as a crisscross shape or a linear shape. During the process of soldering the first end part 221 of the surface-mount connector 22 on the conductive pad 212 of the first circuit board 21, the indentation 223 may function as a venting channel for venting gas which is trapped within the molten conductive pad 212. Since the formation of vacant space is minimized, the impedance and power loss are reduced.

Please refer to FIG. 2B again. A ring-shaped sidewall 224 is extended from the periphery of the second end part 222 in the axial direction such that a receptacle 225 is defined within the ring-shaped sidewall 224 for receiving a solder bump 226 therein. An example of the solder bump 226 includes but is not limited to a solder ball. For example, the indentation 223 of the first end part 221 and the sidewall 224 and the receptacle 225 of the second end part 222 may be formed by an embossing and punching process.

Figure 2E:
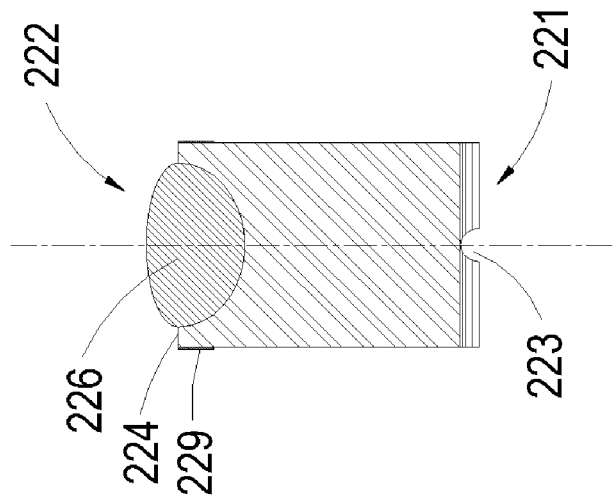
FIG. 2E is a schematic cross-sectional view of the surface-mount connector shown in FIG. 2D take along the line A-A'.
Figure 2D:
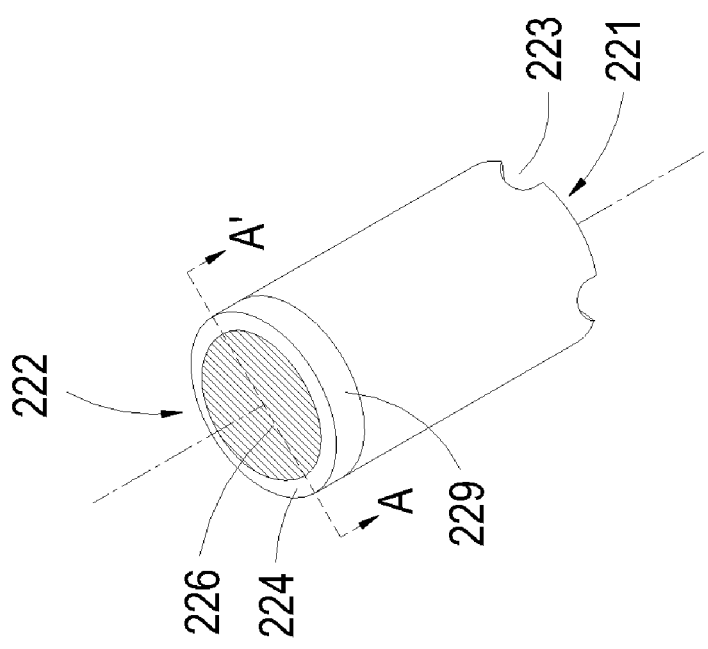
FIG. 2D is a schematic assembled view of the surface-mount connector shown in FIG. 2B.

During the solder bump 226 is heated in the reflow furnace, the solder bump 226 will be molten and received in the receptacle 225. After the molten solder bump 226 is cooled, the solder bump 226 is fixed in the receptacle 225. As known, during the solder bump 226 is molten, the surface of the solder bump 226 becomes curved due to cohesion resulted from the molten solder bump 226. After the molten solder bump 226 is cooled, the solidified solder bump 226 has a curved convex surface. In other word, the solder bump 226 is partially protruded from the sidewall 224, as can be seen in FIG. 2D and 2E. Via the protruded solder bump 226, the surface-mount connector 22 is coupled to a corresponding conductive pad 232 of the second circuit board 23 (as shown in FIGS. 3A and 3B). Optionally, non-solderable primer 229 may be applied on the outer periphery of the sidewall 224 to hinder the molten solder bump 226 from overflowing outside the periphery of the second end part 222.

FIG. 3A is a schematic exploded view illustrating a circuit board assembly by mounting the circuit module of FIG. 2A on the second circuit board. Several electronic components 231 are mounted on the second circuit board 23. Moreover, corresponding to the surface-mount connector 22, the second circuit board 23 has conductive pads 232 (e.g. solder paste, solder pads and the like) on the surface of the second circuit board 23.

Please refer to FIG. 3A again. As previously described, the first circuit board 21 of the circuit module 20 is often subject to deformation during the process of passing through the reflow furnace and it is difficult to control the thickness of the conductive pad 212. As a consequence, the second end parts 22 of the surface-mount connectors 22 are usually not coplanar after the first end parts 221 of these surface-mount connectors 22 are bonded on the first circuit 21. Under this circumstance, there is often a height difference h1 between the second end parts 22 of the relatively longer surface-mount connectors 22a and the relatively shorter surface-mount connectors 22b.

As shown in FIG. 3B, when the circuit module 20 is placed on the second circuit board 23, the curved convex surfaces of the solder bump 226a at the second end parts 222a of the relatively longer surface-mount connectors 22a will be in contact with and supported on corresponding conductive pads 232 of the second circuit board 23. Meanwhile, there is often a height difference h2 between the second end parts 222a of the relatively longer surface-mount connectors 22a and the second circuit board 23.

Figure 3C:
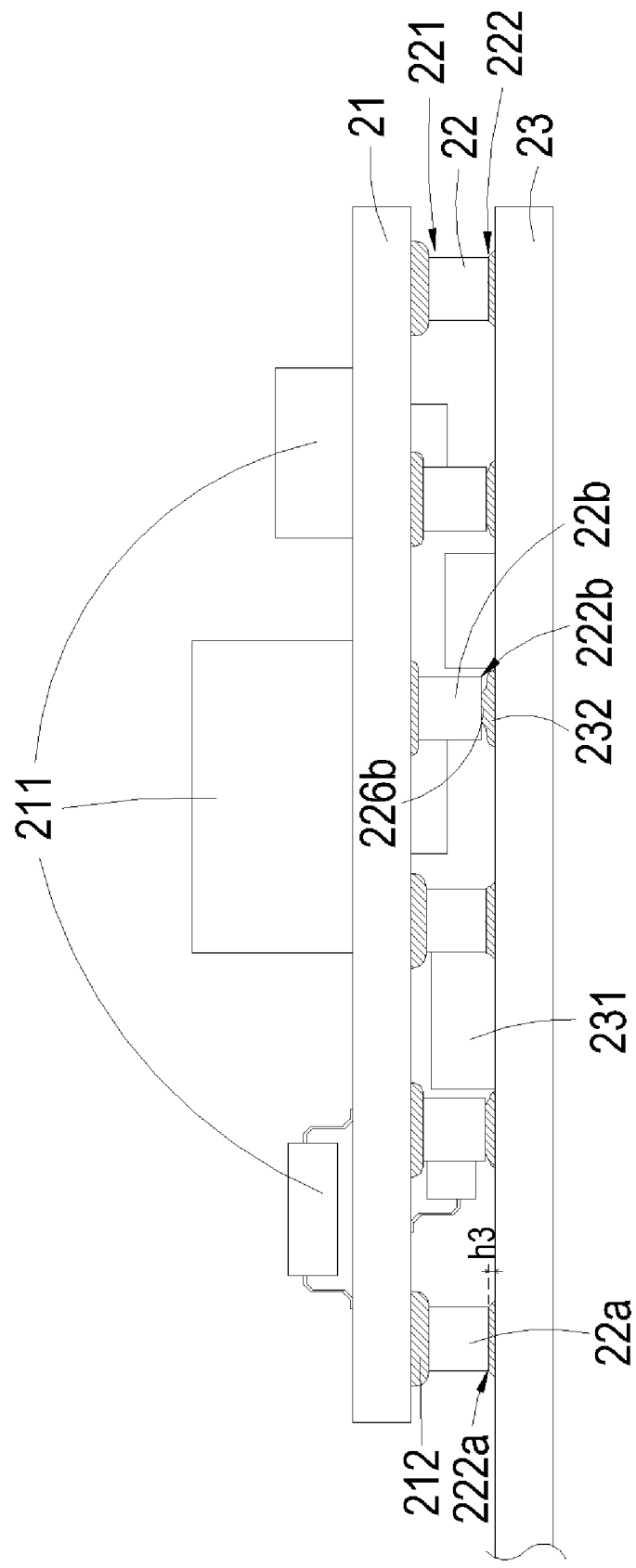
FIG. 3C is a schematic assembled view of the circuit board assembly of FIG. 3B.

After the circuit module 20 and the second circuit board 23 pass through the reflow furnace, the solder bumps 226 will be molten into a liquid state and thus the support forces offered by the solder bumps 226 are lost. Under this circumstance, the circuit module 20 will be naturally moved downwardly due to the gravity itself. As shown in FIG. 3C, after the reflowing process, the height difference between the second end parts 222a of the relatively longer surface-mount connectors 22a and the second circuit board 23 is reduced from h2 (as shown in FIG. 3B) to h3. As a result, the second end parts 222b of the relatively shorter surface-mount connectors 22b are contacted with and fixed on corresponding conductive pads 232.

Since the molten solder bumps 226 flow downwardly, the solder bumps 226 may provide the cushioning effect between the second end parts 222 of the surface-mount connectors 22 and the conductive pads 232 of the second circuit board 23. In other words, even if the height difference h1 between the second end parts 22 of the relatively longer surface-mount connectors 22a and the relatively shorter surface-mount connectors 22b is greater than the thickness of the conductive pads 232 of the second circuit board 23, the solder bump 226a at the second end parts 222a of the relatively longer surface-mount connectors 22a may be in contact with and supported on corresponding conductive pads 232 of the second circuit board 23 (as shown in FIG. 3B). Since the solder bumps 226 are molten into the liquid state during the reflowing process, the circuit module 20 is naturally moved downwardly due to the gravity itself and the second end parts 222b of the relatively shorter surface-mount connectors 22b are contacted with and fixed on corresponding conductive pads 232 via the solder bumps 226b. As a result, the height difference between the relatively shorter surface-mount connector 22b and the corresponding conductive pad 232 of the second circuit board 23 is eliminated. Moreover, since the conductive pad 232 are made of conductive and solderable material, the solder bumps 226 may be firmly fixed on corresponding conductive pads 232 of the second circuit board 23, thereby forming the circuit board assembly of FIG. 3C. Under this circumstance, the electronic components 211 on the first circuit board 21 and the electronic components 231 on the second circuit board 23 are electrically connected with each other.

Furthermore, the non-solderable primer 229 applied on the sidewall 224 may be naturally formed as a retaining wall for hindering the solder paste from overflowing outside the periphery of the second end part 222. As a consequence, the possibility of causing unexpected short circuit by the overflowed solder bumps 226.

Figure 4A:
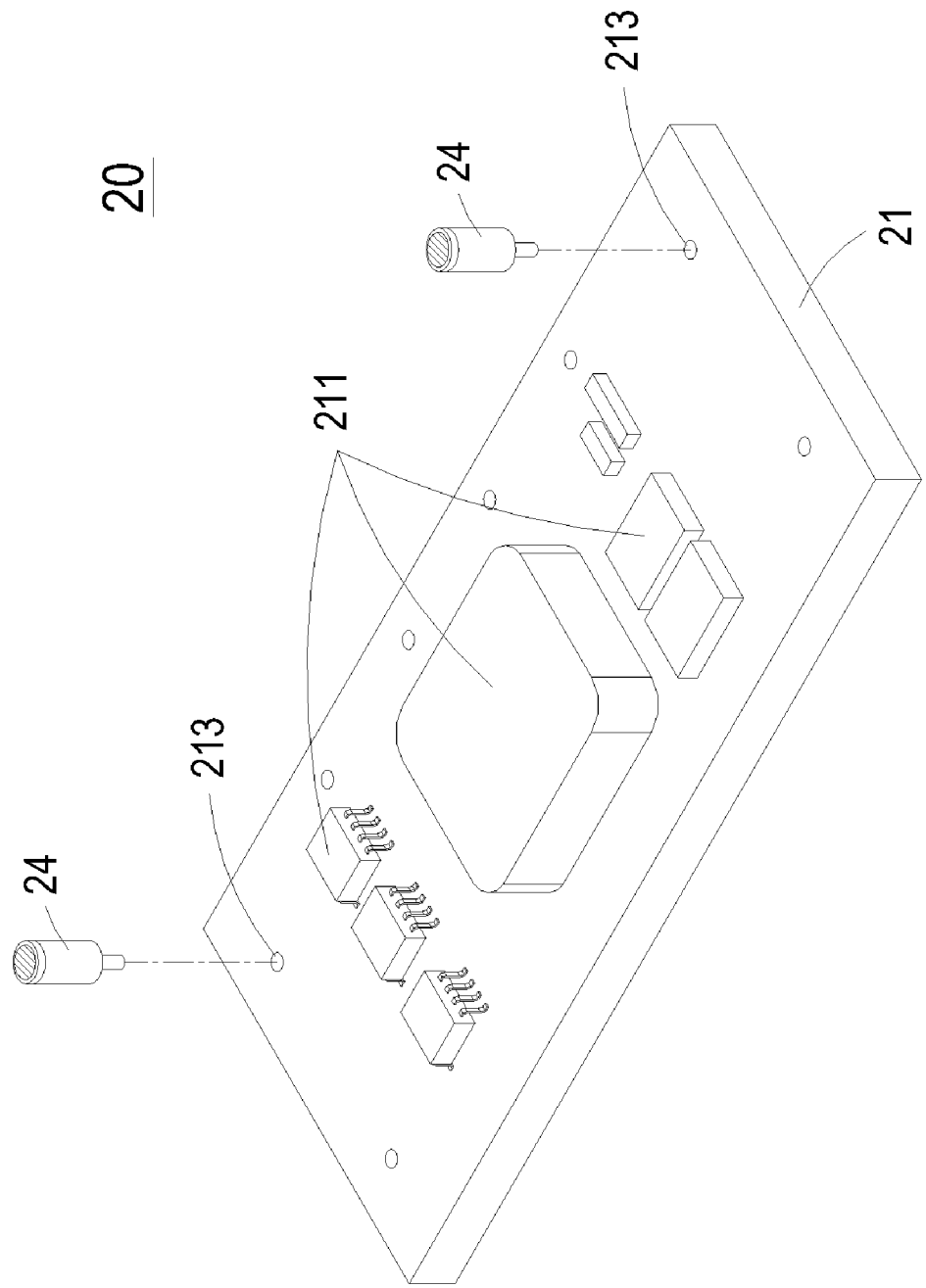
FIG. 4A is a schematic exploded view illustrating a circuit module according to a second preferred embodiment of the present invention.
Figure 4B:
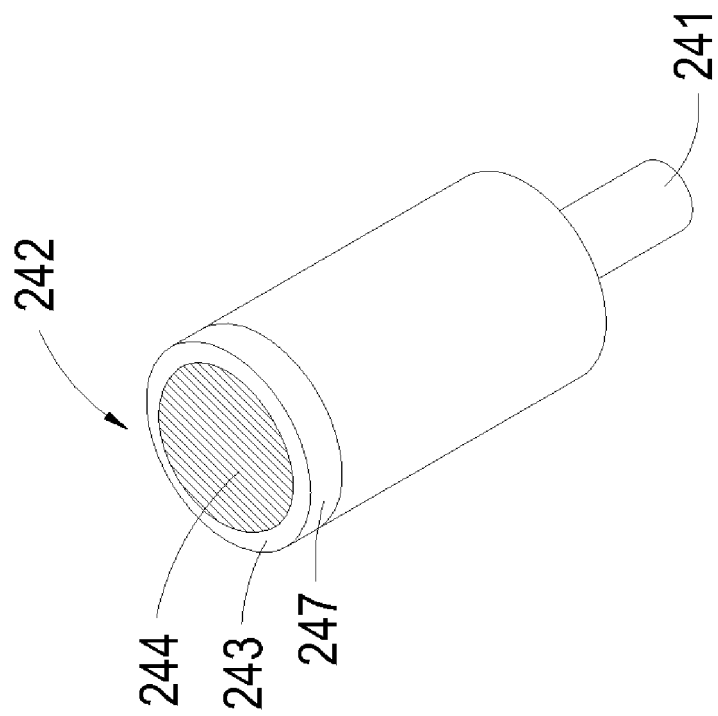
FIG. 4B is a schematic perspective view of one surface-mount connector shown in FIG. 4A.

FIG. 4A is a schematic exploded view illustrating a circuit module according to a second preferred embodiment of the present invention. The circuit module 20 of FIG. 4A principally includes a first circuit board 21 and multiple surface-mount connectors 24. The surface-mount connectors 24 are mounted on the first circuit board 21. In addition, several electronic components 211 are mounted on the first circuit board 21. The first circuit board 21 have multiple through holes 213 in predetermined locations of the surface of first circuit board 21. The inner walls of the through holes 213 have been coated with conductive material (e.g. metallic material). The surface-mount connector 24 has a first end part 241 and a second end part 242. The first end part 241 is a cylindrical rod whose diameter is substantially equal to the diameter of a corresponding through hole 213 (as is also shown in FIG. 4B). After the first end parts 241 of these surface-mount connectors 24 are inserted into corresponding through holes 213 of the first circuit board 21, the circuit module 20 is assembled. The process of fixing the surface-mount connectors 24 on the first circuit board 21 is also referred as a pin-through-hole technology.

The sidewall 243 of the second end part 242, the receptacle (not shown), the solder bump 244 and the non-solderable primer 247 included in FIG. 4B are identical to those shown in FIGS. 2C and 2D, and are not redundantly described herein.

In the above embodiments, the first end part 221 or 241 of the surface-mount connector 22 or 24 may be fixed on the first circuit board 21 according to a surface mount technology (as shown in FIG. 2A) or a pin-through-hole technology (as shown in FIG. 4A) as long as the second end parts 222 or 242 are fixed on the second circuit board 23 according to the surface mount technology of the present invention.

Figure 5A:
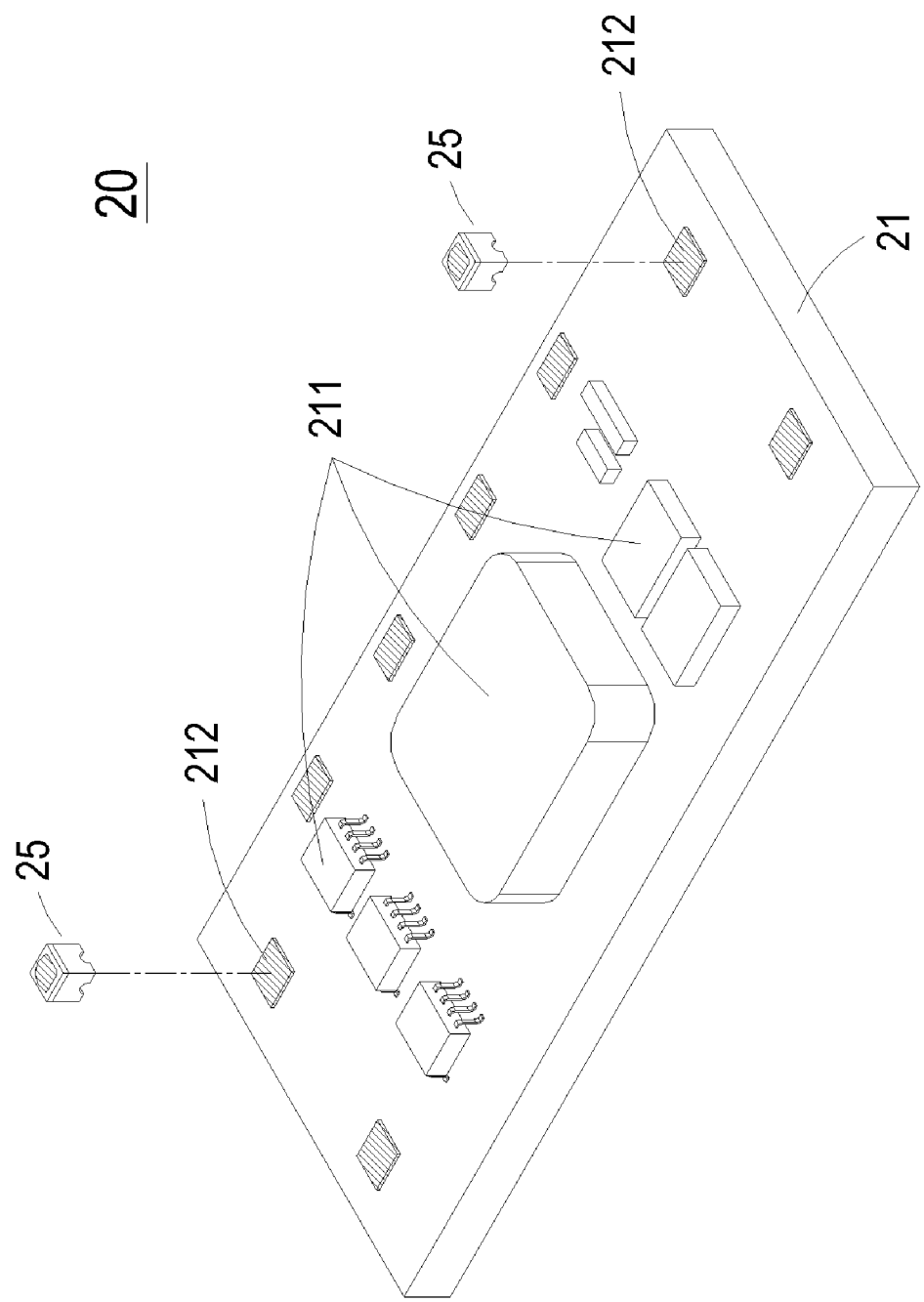
FIG. 5A is a schematic exploded view illustrating a circuit module according to a third preferred embodiment of the present invention.

FIG. 5A is a schematic exploded view illustrating a circuit module according to a third preferred embodiment of the present invention. The circuit module 20 includes a first circuit board 21 and multiple surface-mount connectors 25. The surface-mount connectors 25 are mounted on the first circuit board 21. In addition, several electronic components 211 are mounted on the first circuit board 21. The relative positions between the first circuit board 21, the electronic components 211, the conductive pads 212 and the surface-mount connectors 25 are identical to those as shown in FIG. 2A, and are not redundantly described herein. In this embodiment, the surface-mount connector 25 is substantially a rectangular rod with a length of about 3 mm and a width of about 2 mm (as shown in FIG. 5B). It is of course that the dimension of the surface-mount connector 25 may be adjusted as required. The surface-mount connector 25 includes a first end part 251 and a second end part 252, which are disposed on opposite sides of the surface-mount connector 25. The first end part 251 is connected to the conductive pads 212 of the first circuit board 21. An indentation 253 is formed in the surface of the first end part 251 (as shown in FIG. 5C). The indentation 253 may have an arbitrary shape such as a crisscross shape. During the process of soldering the first end part 251 of the surface-mount connector 25 on the conductive pad 212 of the first circuit board 21, the indentation 253 may function as a venting channel for venting gas which is trapped within the molten conductive pad 212. Since the formation of vacant space is minimized, the impedance and power loss are reduced.

Figure 5D:
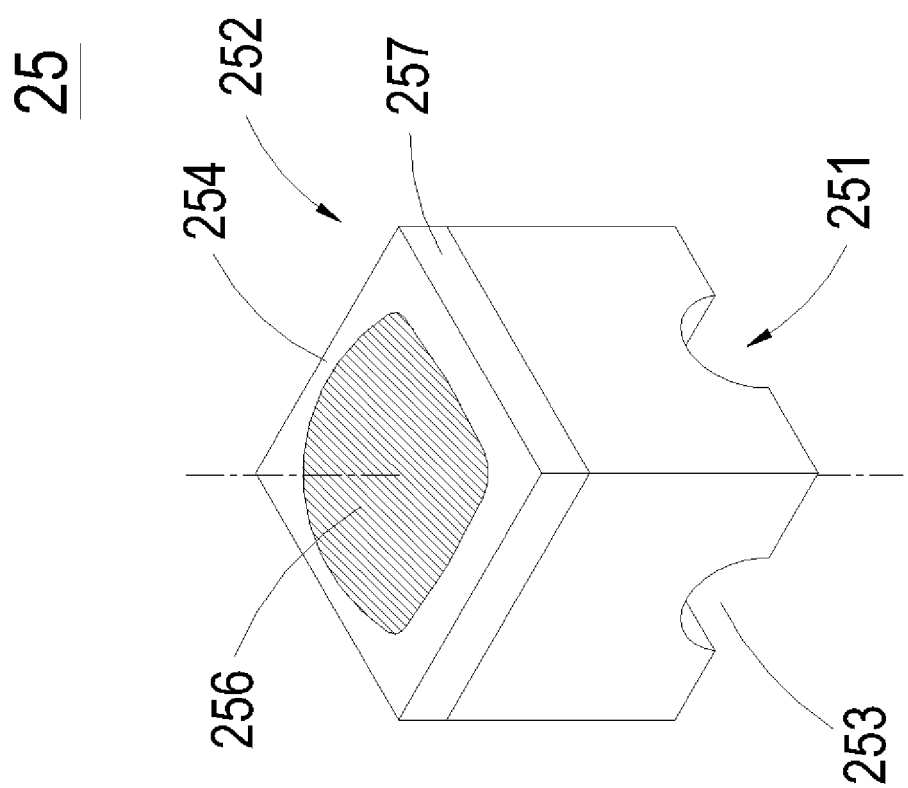
FIG. 5D is a schematic assembled view of the surface-mount connector shown in FIG. 5B.

Please refer to FIG. 5B again. A sidewall 254 is extended from the periphery of the second end part 252 in the axial direction such that a rectangular receptacle 255 is defined within the sidewall 254 for receiving a solder bump 256 therein. For example, the sidewall 254 and the receptacle 255 of the second end part 252 may be formed by an embossing and punching process. An example of the solder bump 256 includes but is not limited to a rectangular solder piece. The profile of the solder bump 256 is substantially mated with the receptacle 255. The volume of the solder bump 256 is slightly larger than the capacity of the receptacle 255. During the solder bump 256 is heated in the reflow furnace, the solder bump 256 will be molten and received in the receptacle 255. After the molten solder bump 256 is cooled, the solder bump 256 is fixed in the receptacle 255. The sidewall 254 may act as a retaining wall hinder the molten solder bump 256 from overflowing outside the periphery of the second end part 252. As known, during the solder bump 256 is molten, the surface of the solder bump 256 becomes curved due to cohesion resulted from the molten solder bump 256. After the molten solder bump 256 is cooled, the solidified solder bump 256 has a curved convex surface (as shown in FIG. 5D). Since the volume of the solder bump 256 is slightly larger than the capacity of the receptacle 255, the solder bump 256 is partially protruded from the sidewall 254 in the axial direction. Optionally, non-solderable primer 257 may be applied on the outer periphery of the sidewall 254 to hinder the molten solder bump 256 from overflowing outside the periphery of the second end part 252.

By the soldering process as described in FIGS. 3A~3C, the surface-mount connectors 25 of the circuit module 20 of FIG. 5A may be coupled to corresponding conductive pads 232 of the second circuit board 23 via the protruded conductive part (i.e. the solder bump 256). Since the solder bump 256 is partially protruded from the sidewall 254, the solder bump 256 at the second end parts 252 of the relatively longer surface-mount connectors 25 will be in contact with and supported on corresponding conductive pads 232 of the second circuit board 23 when the circuit module 20 is placed on the second circuit board 23. Since the solder bumps 256 are molten into the liquid state during the reflowing process, the circuit module 20 is naturally moved downwardly due to the gravity itself and the second end parts 252 of the relatively shorter surface-mount connectors 25 will be contacted with and fixed on corresponding conductive pads 232. As a result, the height difference between the relatively shorter surface-mount connector 25 and the corresponding conductive pad 232 of the second circuit board 23 is eliminated. Moreover, since the conductive pad 232 are made of conductive and solderable material, the solder bumps 256 may be firmly fixed on corresponding conductive pads 232 of the second circuit board 23, thereby forming a circuit board assembly. Under this circumstance, the first circuit board 21 and the electronic components 231 of the second circuit board 23 are electrically connected with each other through the surface-mount connectors 25.

In the above embodiments, the solder bumps of the surface-mount connectors may provide the cushioning effect between the second end parts of the surface-mount connectors and the conductive pads of the second circuit board. After the solder bumps of the surface-mount connectors are welded on corresponding conductive pads, the first circuit board is electrically connected to the second circuit board. Alternatively, the conductive pads of the second circuit board may be replaced by solder paste.

In the above embodiments, the first end part 221 or 241 of the surface-mount connector 22 or 24 may be fixed on the first circuit board 21 according to a surface mount technology (as shown in FIG. 2A) or a pin-through-hole technology (as shown in FIG. 4A) as long as the second end parts 222 or 242 are fixed on the second circuit board 23 according to the surface mount technology of the present invention. Moreover, the surface-mount connector may have an arbitrary shape such as a cylindrical rod (as shown in FIGS. 2D and 4B) or a rectangular rod (as shown in FIG. 5D).

Since the surface-mount connector of the present invention is solid rod, the surface-mount connector may withstand a great amount of current and possess excellent thermal conductivity. Since the solder bump is partially protruded from the sidewall, the solder bump at the second end parts of the relatively longer surface-mount connectors will be in contact with and supported on corresponding conductive pads of the second circuit board when the circuit module is placed on the second circuit board. After the solder bumps are molten, the circuit module is naturally moved downwardly due to the gravity itself and the second end parts of the relatively shorter surface-mount connectors will be contacted with and fixed on corresponding conductive pads. As a result, the height difference between the relatively shorter surface-mount connector and the corresponding conductive pad of the second circuit board is eliminated. That is, the surface-mount connectors are nearly coplanar after the reflowing process. The surface-mount connectors of the present invention may electrically and/or structurally interconnect the first circuit board and the second circuit board. Depending on the degree of formation of the first circuit board, the amount of the solder bump may be varied in order to achieve desired evenness of the surface-mount connectors. Therefore, the product yield is increased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A surface-mount connector for electrically interconnecting a first circuit board and a second circuit board, said surface-mount connector comprising:
    a first end part bonded onto said first circuit board, wherein an indentation is formed in a surface of said first end part to function as a venting channel for venting gas during said first end part is bonded onto said first circuit board according to a surface mount technology; and
    a second end part having a sidewall, a receptacle defined within said sidewall, and a solder bump received in said receptacle, wherein said second circuit board has a conductive pad corresponding to said second end part, said solder bump is partially protruded from said sidewall and then melted during a reflowing process to be bonded onto said conductive pad of said second circuit board such that said first circuit board and said second circuit board are electrically connected to each other.

2. The surface-mount connector according to claim 1 wherein said sidewall is extended from the periphery of said second end part.

3. The surface-mount connector according to claim 1 wherein the outer periphery of said sidewall is coated with non-solderable primer.

4. The surface-mount connector according to claim 1 wherein said first circuit board has a through hole corresponding to said first end part, and said first end part is inserted into said through hole of said first circuit board.

5. The surface-mount connector according to claim 1 wherein said solder bump is partially protruded from said sidewall to form a curved convex surface.

6. A circuit board assembly comprising:
   a first circuit board;
   a second circuit board; and
   multiple surface-mount connectors arranged between said first circuit board and said second circuit board, each surface-mount connector comprising a first end part and a second end part, wherein said first end part is bonded onto said first circuit board, an indentation is formed in a surface of said first end part to function as a venting channel for venting gas during said first end part is bonded onto said first circuit board according to a surface mount technology, said second end part has a sidewall, a receptacle defined within said sidewall, and a solder bump received in said receptacle, said second circuit board has multiple conductive pads corresponding to said second end parts, and said solder bump is partially protruded from said sidewall and then melted during a reflowing process to be bonded onto said conductive pad of said second circuit board such that said first circuit board and said second circuit board are electrically connected to each other.

7. The circuit board assembly according to claim 6 wherein said sidewall is extended from the periphery of said second end part.

8. The circuit board assembly according to claim 6 wherein the outer periphery of said sidewall is coated with non-solderable primer.

9. The circuit board assembly according to claim 6 wherein said first circuit board has multiple through holes corresponding to said first end parts of said surface-mount connectors, and said first end parts are inserted into said through holes of said first circuit board.

10. The circuit board assembly according to claim 6 wherein said solder bump is partially protruded from said sidewall to form a curved convex surface.

11. A circuit module to be mounted on a system board, said circuit module comprising:
    a circuit board; and
    multiple surface-mount connectors, each of which comprising a first end part and a second end part, wherein said first end part is bonded onto said circuit board, an indentation is formed in a surface of said first end part to function as a venting channel for venting gas during said first end part is bonded onto said first circuit board according to a surface mount technology, said second end part has a sidewall, a receptacle defined within said sidewall, and a solder bump received in said receptacle, said system board has multiple conductive pads corresponding to said second end parts, and said solder bump is partially protruded from said sidewall and then melted during a reflowing process to be bonded onto said conductive pad of said system board such that said circuit board is electrically connected to said system board.

12. The circuit module according to claim 11 wherein said sidewall of said surface-mount connector is extended from the periphery of said second end part, and said solder bump is partially protruded from said sidewall to form a curved convex surface.

13. The circuit module according to claim 11 wherein the outer periphery of said sidewall is coated with non-solderable primer.

14. The circuit module according to claim 11 wherein said circuit board has multiple through holes corresponding to said first end parts of said surface-mount connectors, and said first end parts are inserted into said through holes of said circuit board.

* * * * *